(12) United States Patent
Sharma et al.

(10) Patent No.: US 7,394,840 B2
(45) Date of Patent: Jul. 1, 2008

(54) VIRTUAL OPTICAL AXIS DETERMINATION USING MACHINE VISION FOR PASSIVE OPTICAL ALIGNMENT

(75) Inventors: Manish Sharma, Cupertino, CA (US); Sergei Sochava, Sunnyvale, CA (US); Eric Montei, Edina, MN (US)

(73) Assignee: Intel Corporation, Santa Clara, CA (US)

(*) Notice: Subject to any disclaimer, the term of this patent is extended or adjusted under 35 U.S.C. 154(b) by 285 days.

(21) Appl. No.: 11/171,899

(22) Filed: Jun. 30, 2005

(65) Prior Publication Data

US 2007/0002911 A1   Jan. 4, 2007

(51) Int. Cl.
*H01S 3/13* (2006.01)
*H01S 3/08* (2006.01)

(52) U.S. Cl. .................... 372/29.022; 372/107
(58) Field of Classification Search ............ 372/29.022, 372/107
See application file for complete search history.

(56) References Cited

U.S. PATENT DOCUMENTS

| | | | |
|---|---|---|---|
| 6,757,063 B2 * | 6/2004 | Kogan et al. | 356/399 |
| 6,822,996 B1 * | 11/2004 | Pace et al. | 372/109 |
| 2002/0097760 A1 * | 7/2002 | May | 372/18 |

FOREIGN PATENT DOCUMENTS

| | | |
|---|---|---|
| WO | WO 02/065178 | 8/2002 |
| WO | WO02065178 A2 * | 8/2002 |

OTHER PUBLICATIONS

International Search Report for International Application No. PCT/US2006/025934 dated Dec. 14, 2006.
Written Opinion for International Application No. PCT/US2006/025934 dated Dec. 14, 2006.

* cited by examiner

*Primary Examiner*—Minsun Harvey
*Assistant Examiner*—Joshua King
(74) *Attorney, Agent, or Firm*—Marshall, Gerstein & Borun LLP

(57) ABSTRACT

Alignment of a laser apparatus is achieved by actively aligning components of the laser apparatus and then passively deriving an optical axis from that alignment. This passive derivation can be achieved by identifying features of an actively aligned optical element, deriving positional data for those features, and developing an optical axis from that positional data. The derivation of positional data may be performed over a particular coordinate system of an image taken of the feature, e.g., obtained by a vision system. The positional data and optical axis may be extrapolated out to a reference coordinate system for use in passively aligning other optical elements.

18 Claims, 9 Drawing Sheets

VIRTUAL OPTICAL AXIS DETERMINATION USING MACHINE VISION FOR PASSIVE OPTICAL ALIGNMENT

FIELD OF THE DISCLOSURE

The present disclosure relates generally to aligning optical components and, more particularly, to determining an optical axis for aligning optical components.

BACKGROUND OF RELATED ART

Fiberoptic telecommunications are continually subject to demands for increased bandwidth. One way that bandwidth expansion has been accomplished is through dense wavelength division multiplexing (DWDM). With a DWDM system many different and separate data streams may concurrently exist in a single optical fiber. Each data stream represents a different channel within the optical fiber, where each channel exists at a different channel wavelength. The modulated output beam of a laser operating at the desired channel wavelength creates the data stream. Multiple lasers are used to create multiple data streams, and these data streams are combined onto a single fiber for transmission in their respective channels.

The International Telecommunications Union (ITU) presently requires channel separations of approximately 0.4 nanometers, or about 50 GHz. This channel separation allows up to 128 channels to be carried by a single fiber within the bandwidth range of currently available fibers and fiber amplifiers.

With the requirement for multiple tightly spaced channels, stable control over the laser source's output frequency is important to system effectiveness. The lasers used in DWDM systems typically have been based on distributed feedback (DFB) lasers operating with a reference etalon that defines the ITU wavelength grid. Due to manufacturing as well as performance limitations, DFB lasers are used as single channel lasers, or as lasers limited to tuning among a small number of adjacent channels. As a result, DWDM applications would require multiple different DFB lasers each at a different channel wavelength.

Continuously tunable external cavity lasers have been developed to overcome the limitations of DFB lasers. These lasers have a laser source and reflective element that define an external cavity, where this external cavity is used for wavelength tuning. For example, a tuning element within the external cavity, such as, an etalon device, is mounted to a support that is fixed to the platform between the laser source and reflective element. Controlling the temperature of the platform tunes the laser by altering the optical path length of the external cavity. Separate tuning between grid wavelengths is achieved by separately tuning the tuning element.

While continuously tunable lasers are desirable over DFB lasers for certain applications, assembling these lasers is a time consuming process. Each component in the external cavity interacting with the laser beam is carefully adjusted for optimum performance. In the optical domain, this means that each component must be optically aligned so that they work in concert. Optical alignment is quite difficult, however, as optical alignment is dynamic where the mere act of 'aligning' one component can misalign another component. Currently, optical alignment is performed actively, where a component is positioned in the optical path of a laser beam, e.g., in the external cavity, and the resulting effect of that component on the laser beam is measured. With a spectrum analyzer, a component may be positioned and repositioned in a laser device until the desired effect of that component on the overall output laser beam is achieved. Then the next component is actively optimized. This process is time consuming and requires expensive instrumentation and complicated manual or automated algorithms to complete. The process is inefficient as well. With dual etalon tuners, each etalon is separately and actively aligned with the laser, adding to overall alignment time.

DETAILED DESCRIPTION OF AN EXAMPLE

Figure 1:
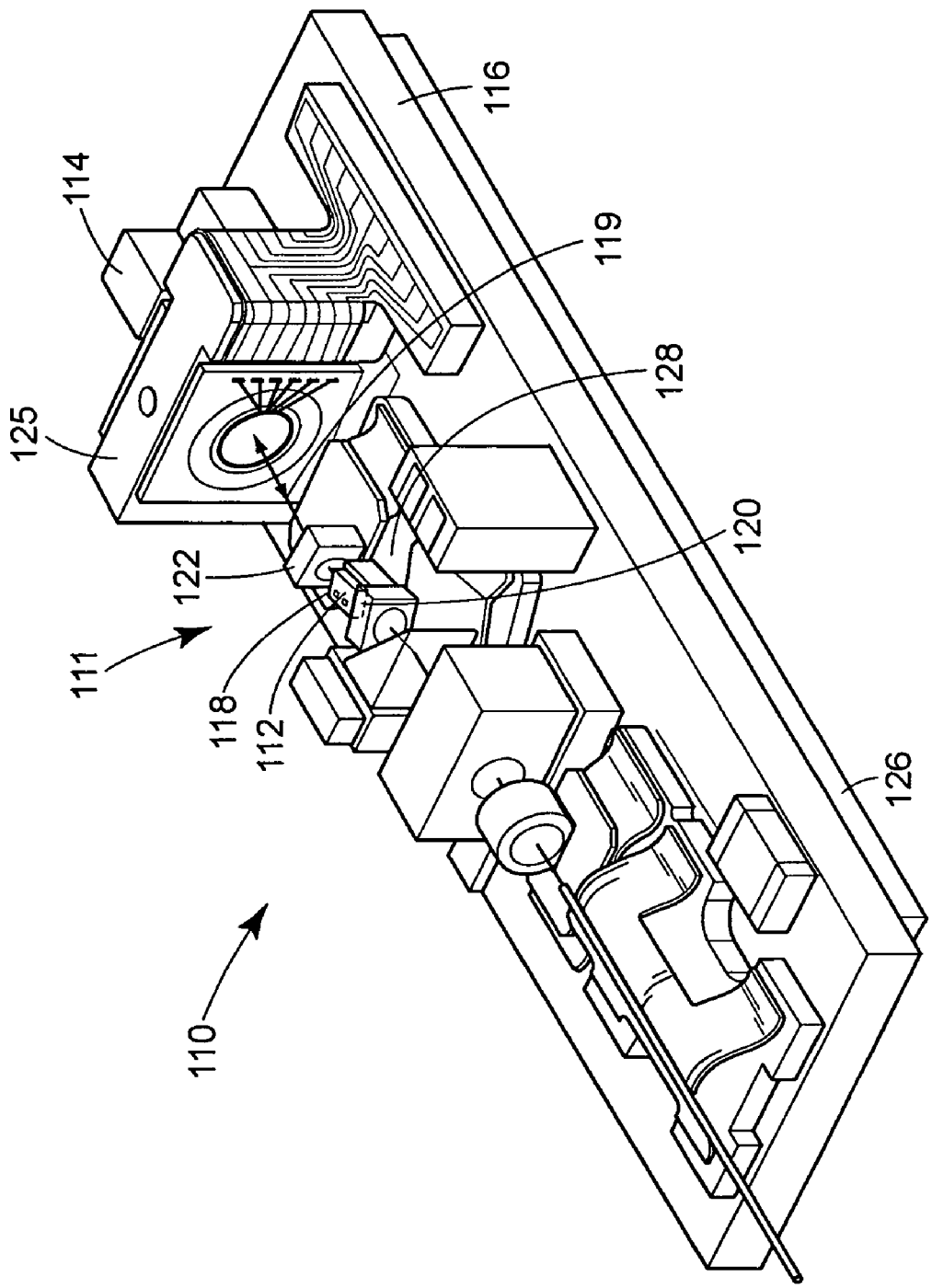
FIG. 1 illustrates an example laser apparatus, including a laser gain medium, reflective element, and wavelength selection element.

FIG. 1 shows a laser apparatus 110 with a thermo-optically tunable external cavity laser. The apparatus 110 includes a laser device 111 with a gain medium 112. The apparatus 110 also includes a reflective element 114 coupled to a thermally conductive platform 116 to which the laser device 111 is also coupled. The gain medium 112 may comprise, for example, a conventional Fabry-Perot diode emitter chip with an anti-reflection (AR) coated first facet (not shown) and a partially reflective opposing facet 120. The reflective element 114 is an end mirror in the illustrated example, but more generally may comprise a grating, prism or other reflector or retroreflector. In the illustrated configuration, the external laser cavity extends from the facet 120 to reflective element 114, and has an optical path length. Gain medium 112 emits a light beam that is collimated by lens 122. The collimated beam is reflected from end reflector 114 and returned along the optical path to gain medium 112 by the lens 122. A wavelength selection device 125 is positioned in the optical path to feed back light to the gain medium 112 at a selected wavelength. The end mirror 114 may be curved in certain embodiments such that lens 122 may be omitted. Other alternatives will be apparent to persons skilled in the art, including for example the use of a toric lens system or other optical element(s) capable of re-imaging the returning beam 119 onto facet 118, so that gain medium 112 receives feedback from the external cavity, in place of lens 122.

The wavelength selection device 125 is mounted to the platform 116, which is coupled to a thermoelectric controller (TEC) 126 that controls the temperature of the platform 116 via thermal conduction. The TEC 126 controls the temperature of the platform 116 for tuning the components of the external cavity, where such tuning adjusts the optical path length of the laser apparatus 110. The wavelength selection device or tuner 125 may be tuned such that the apparatus 110 has a single emission peak within a wavelength range of interest such as, for example, the gain bandwidth of gain medium 124, the wavelength range of the ITU (International Telecommunications Union) "C" band (approximately 192.1 THz to approximately 196.1 THz or approximately 1525 to approximately 1565 nanometers), or other wavelength range. The emission peak of the full laser is determined by that of the tuner 125.

The thermally conductive platform 116 may be made from any thermally conductive material, examples of which include various metals, metal nitrites, carbides and oxides, or alloys, blends, mixtures or composites thereof, which provide materials with good thermal conductivity and relatively low CTE. Aluminum nitride (AlN) may be used as the platform material in certain embodiments. The material of platform 116 may be selected to have a particular CTE that allows CTE matching to components mounted on the platform 116. In some embodiments, platform 116 may comprise a high CTE material, such as aluminum, copper, zinc or other metal or metal alloy, so that a desired amount of physical expansion and contraction according to temperature control of the TEC 126 may occur. A controller not shown may control operation of the TEC 126. The platform 116 may in certain embodiments be made of silicon, allowing CTE matching to silicon components such as thermally tuned etalons. The use of silicon for platform 116 also allows for the integration of conductor paths directly onto the platform 116, and formation of specific geometries on platform 116 using conventional silicon machining and fabrication techniques.

The gain medium 112 may be thermally coupled to platform 116 such that the TEC 126 may control the temperature of gain medium 112. "Thermal coupling" as used herein means any mounting or coupling arrangement or configuration that provides effective heat flow for thermal control of thermally coupled components. Gain medium 112, for example, may be mounted on a thermally conductive carrier 128 coupled to platform 116. The carrier 128 may comprise a thermally conductive material such as a metal, metal oxide, metal nitride, metal carbide, or alloys, blends, mixtures or composites thereof. In other examples, and by way of example not limitation, the carrier 128 may comprises aluminum nitride, silicon carbide, or a silicon carbide blend (alloy). In yet other examples, carrier 128 may comprise a copper tungsten (CuW) alloy. Further still, the substrate 116 and carrier 128 may be matched in CTE to each other and to gain medium 112. Thermally conductive adhesives or solders may be used to mount gain medium 112 onto carrier 128, and to mount carrier 128 and/or other various structures onto the platform 116.

The reflective element 114 may also be mounted on platform 116 as noted above and may, in certain embodiments, be thermally coupled to platform 116 using thermally conductive adhesives, solders and/or carriers or supports.

Figure 2:
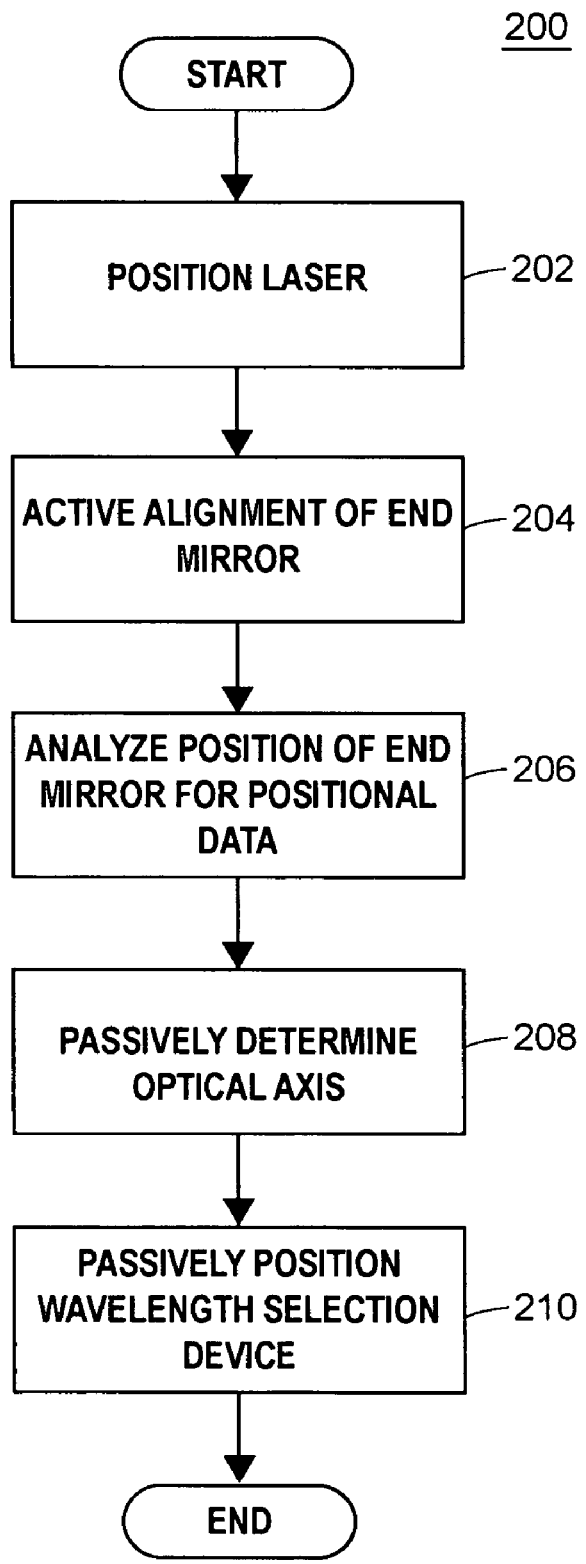
FIG. 2 illustrates an example flow diagram for assembling the laser apparatus of FIG. 1, including passively deriving an optical axis.

An external cavity and attendant components should be aligned for efficient operation with a laser source. FIG. 2 illustrates an example process 200 for aligning various components of the laser apparatus 110. A block 202 mounts the laser device 111, with the gain medium 112 and the carrier 128, to the platform 116. Although it is not necessary, in the example of FIG. 2 the placement of the laser source is performed first to serve as the starting reference point. By way of example, the block 202 may use a pick-and-place assembly process to mount the device 111 at a particular position identified on the platform 116. Alternatively, or additionally, a machine vision system may be used to determine the mounting position of the laser device 110 from markings on the platform 116.

Mounting the laser on the platform sets a first parameter for determining the optical axis, as the gain medium 112 defines the external cavity with the end mirror 114. To establish the external laser cavity and a second parameter, a block 204 actively aligns the end mirror 114, where such active alignment may include positioning the end mirror 114 at a preliminary position, detecting the laser signal emitted from output facet 120 of the gain medium 112, if any, and adjusting the orientation of the end mirror 114, as needed. Example detectors include wavelength, intensity, or beam profile detectors, including spectrum analyzers, interferometers, and photo diodes. Once actively aligned, the end mirror 114 may then be mounted in place using solder, adhesive, laser welding or other techniques. Alternatively, the end mirror 114 may be held in position by clamping means or a translational member, such as a robotic assembly arm, for adjustment during assembly. Although described in reference to aligning an end mirror 114, the block 204 may be used to actively align other optical elements for establishing an optical axis.

With the end mirror 114 actively aligned at block 204, a block 206 analyzes the position of the end mirror 114, e.g., via a machine vision system that captures high-magnification images of the end mirror to precisely determine the position of various markers or indicators. The block 206 may take numerous images of the end mirror 114, from numerous locations, and over different magnifications to derive positional data of the end mirror 114. A block 208 takes that positional data and passively determines an optical axis for the external cavity side of the laser apparatus 110. After the optical axis for the laser apparatus has been determined, a block 210 may passively position the wavelength selection device 125 and any other optical elements by aligning them with respect to this optical axis and without having to resort to active measurement techniques. A similar method can be employed to determine a corresponding virtual optical axis, using other actively aligned optical components, for the output (fiber) side of the laser apparatus 110.

Figure 3:
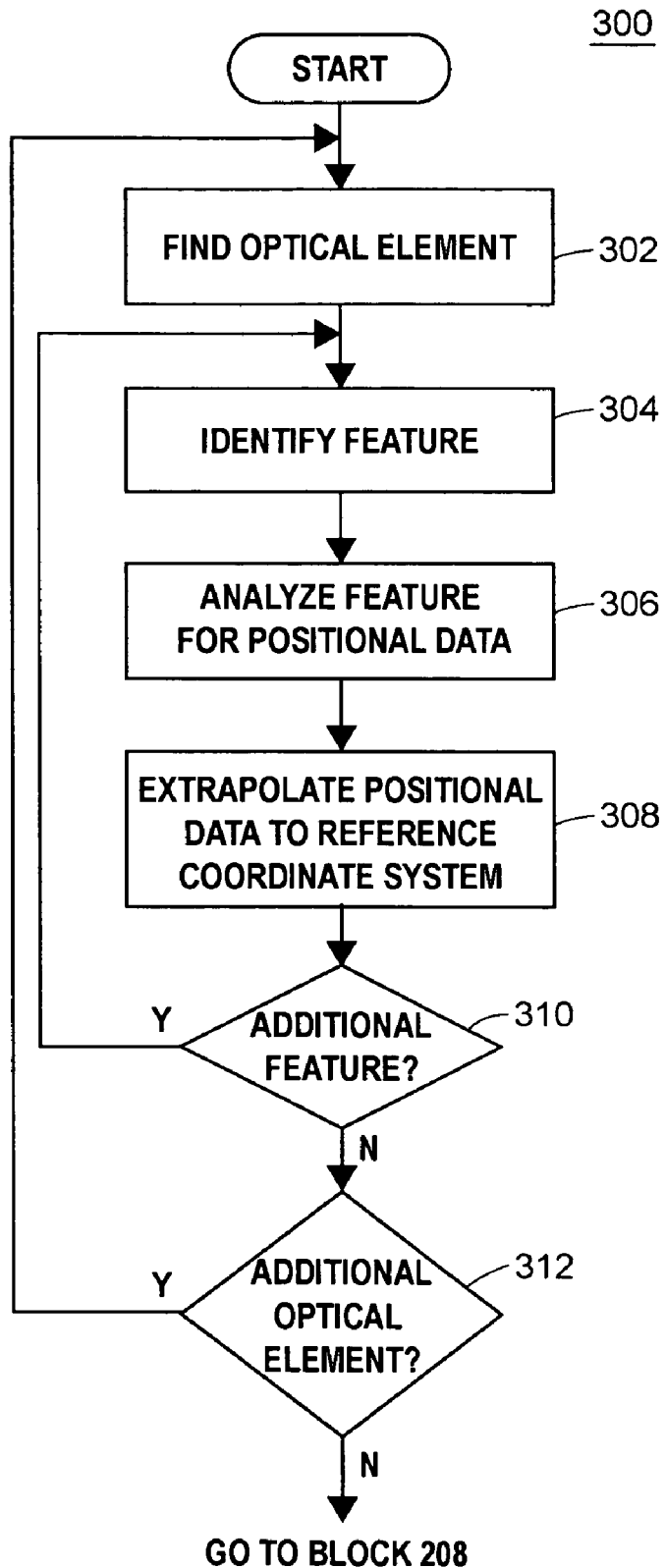
FIG. 3 illustrates an example detailed diagram for passively determining an optical axis in accordance with an example.

From blocks 206 and 208, a passive optical axis, or virtual optical axis, is determined based on the active alignment of an optical element in an external cavity. FIG. 3 illustrates an example process 300 that may be executed by the block 206 in determining the positional data provided to block 208. A block 302 finds a first optical element whose positional data is to be analyzed, such as the end mirror 114. The block 302 may be programmed to poll a user to identify the optical element for examination, or the block 302 may be programmed to automatically determine the optical element based on stored data, including image data, for example. The block 302 may control a machine vision apparatus that visually identifies the optical element, its relative size and general position. From this initial data, the block 302 may determine the amount of magnification needed for resolving markers on the optical element. The block 302 may also store position and magnification data for the camera/lens of a machine vision system so that positional data derived for the optical element can be extrapolated into a reference coordinate system, as discussed further below.

A block 304 determines a first feature of the optical element to be examined, e.g., the location of an edge, corner, face, or marker on the element. As examples, the feature may be indicative of an X-position, Y-position, Z-position, yaw orientation, pitch orientation, or a combination of these. A block 306 visually analyzes the image taken by block 302 and forms positional data indicative of the feature, e.g., by positioning a camera/lens of the machine vision system over the feature if that has not already occurred at block 302, or by digitally magnifying a portion of a larger image captured by the camera/lens. The block 306 may then magnify the image of that feature a sufficient amount to allow for accurate measurement. Such magnification may be achieved mechanically, optically, or digitally. To enhance resolution and identification of the feature or the optical element, a reflective surface may be formed on the platform that supports the optical element to produce a higher contrast image. For example, to allow better resolution of an edge of a mirror, the mirror may be mounted on a gold (Au) reflective layer so that a top view image of the edge has a sufficiently high contrast to a vision system. If the block 306 moves the camera/lens, then the block 306 may record data for that movement as well as any magnification data for coordinate system extrapolation. In the illustrated example, if either the block 302 in initially identifying the optical element or the block 306 in identifying a feature of that element move or magnify the camera/lens in a machine vision system, then the positional data taken during the process 300 may have been obtained in a secondary coordinate system obtained that will need to be extrapolated into a reference coordinate system. The secondary coordinate system may be a magnified rendition of a reference coordinate system for the entire laser apparatus 110.

The block 306 determines a value for the positional data in this secondary coordinate system. A block 308 then extrapolates this positional data taken in the secondary coordinate system to a reference coordinate system for the overall laser apparatus. This allows the process 300 to zoom in on a feature of the actively aligned optical element (such as an edge), accurately measure the feature and derive positional data (such as an approximation line of the edge), and convert that positional data to an optical axis in another coordinate system that includes other optical elements, i.e., the laser device 111.

A block 310 determines whether there is an additional feature on the optical element to analyze. If there is, control is returned to block 306, otherwise control is passed to block 312 which determines if there are additional optical elements to analyze, as shown. When there are no more optical elements and no more features to analyze, control is passed to block 208 for optical axis determination.

It will be appreciated that these blocks are presented by way of example. The process 300 is not limited to the particular configuration, but instead may be implemented in a different order and with different blocks, including additional or fewer blocks.

Figure 4:
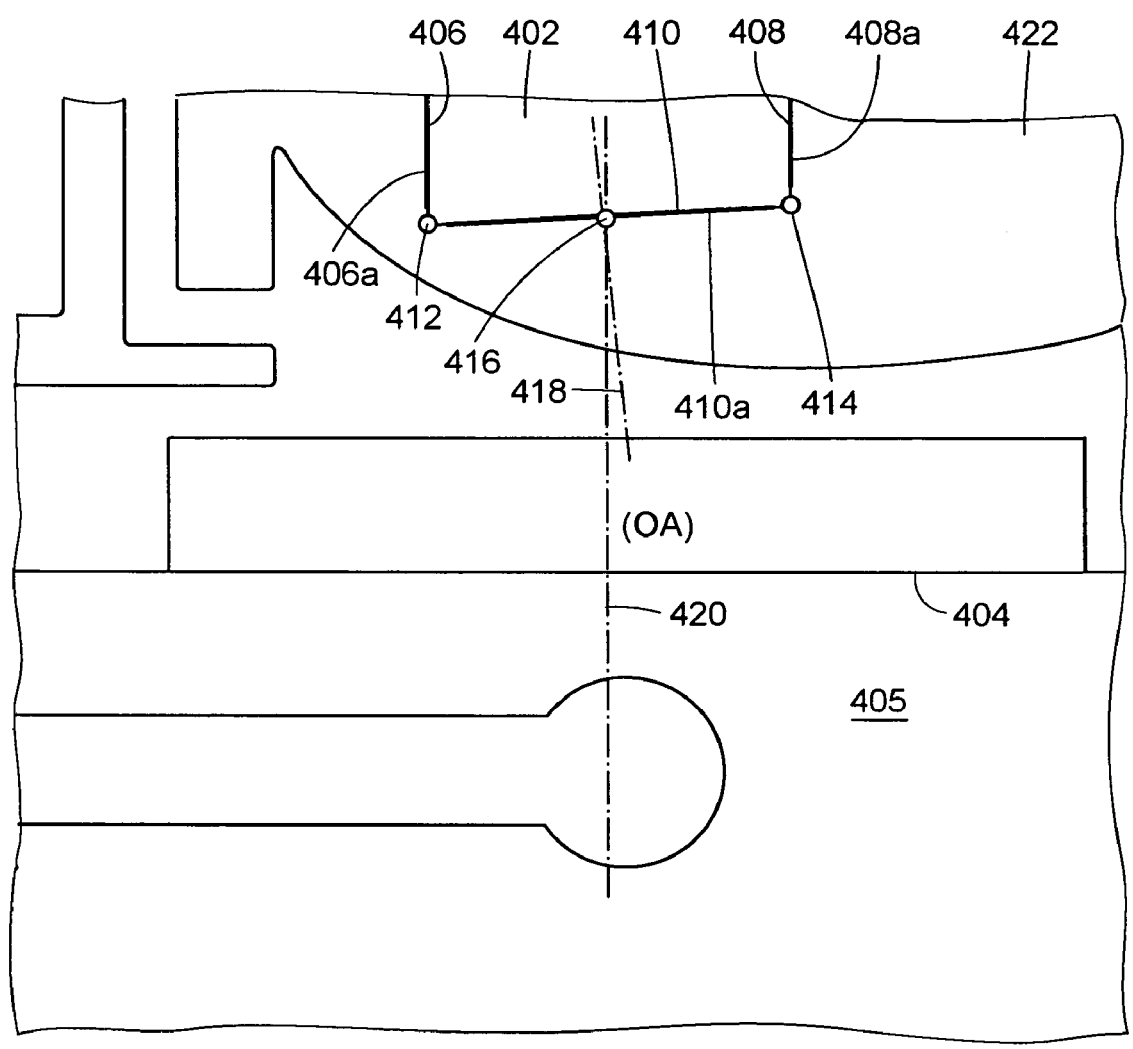
FIG. 4 illustrates an example image taken of an actively aligned optical element from which a virtual optical axis may be derived.

FIG. 4 shows an example magnified image 400 of an example end mirror 402 that may be used as the end mirror 114. For illustration purposes, the image 400 also includes an optical filter 404 on a carrier 405, for example one etalon of a Vernier effect etalon pair used in tuning the frequency of a laser beam from the laser apparatus. An example passive determination of an optical axis will now be described.

A feature, edge 406, is identified by a machine vision apparatus, which then derives positional data for that edge in the form of an approximation line 406a. A second feature, edge 408, opposing edge 406, is identified and positional data in the form of approximation line 408a along this edge derived. The positional data defines a lateral extent for the end mirror 402. A third feature, front edge 410 is identified and a corresponding positional data line 410a is derived, as well. From these three positional data, the machine vision system can intersect lines 406a and 410a to derive a bottom left corner 412, intersect lines 408a and 410a to derive a bottom right corner 414, and find a midpoint 416 for the positional values of the two corners 412, 414.

With the midpoint of the front edge of the end mirror calculated, a line 418 perpendicular to the line 410a is developed. The optical axis is passively determined from line 418, and an offset angle between the line 418 (FIG. 5) and an axial line 420 (FIG. 4), also passing through point 416 but not necessarily orthogonal to line 410a. A sample formula for the offset angle is $\phi = \sin^{-1}(n \times \sin \alpha)$, where n is the refractive index of the end mirror material, $\alpha$ is the wedge angle of the end mirror 402. The end mirror 402 is made of a single crystal of lithium niobate. The reflective coating is deposited on the back facet of the crystal (not shown). The front facet of the crystal is coated with an antireflection coating and tilted with respect to the back facet in order to avoid any unwanted feedback to the gain chip. This tilt (referred here as a wedge angle) results in refraction of the optical beam at the front facet of the crystal. As a result, light propagation direction line 420 does not coincide with the line perpendicular to the front facet 418. Line 418 is perpendicular to the end mirror edge 410 and is just shown for reference, so that the direction of the offset (clockwise) for the optical axis line 420 is clear. If the end-mirror 402 is oriented 180 degrees off in roll, then the offset applied will be counterclockwise.

Thus, in the description of FIG. 4, a machine vision system accurately establishes the mid-point of the front edge of an end mirror, as well as the yaw angle of that edge, indicated by the angular offset $\phi$. From this positional data, a virtual optical axis is calculated at the angular offset, and based on Snell's law. This virtual optical axis is derived for the field of view of the image in FIG. 4, and thus is in a secondary coordinate system in the illustrated example. But once the virtual optical axis has been verified it may be used for other fields of view and extrapolated into other coordinate systems.

Figure 5:
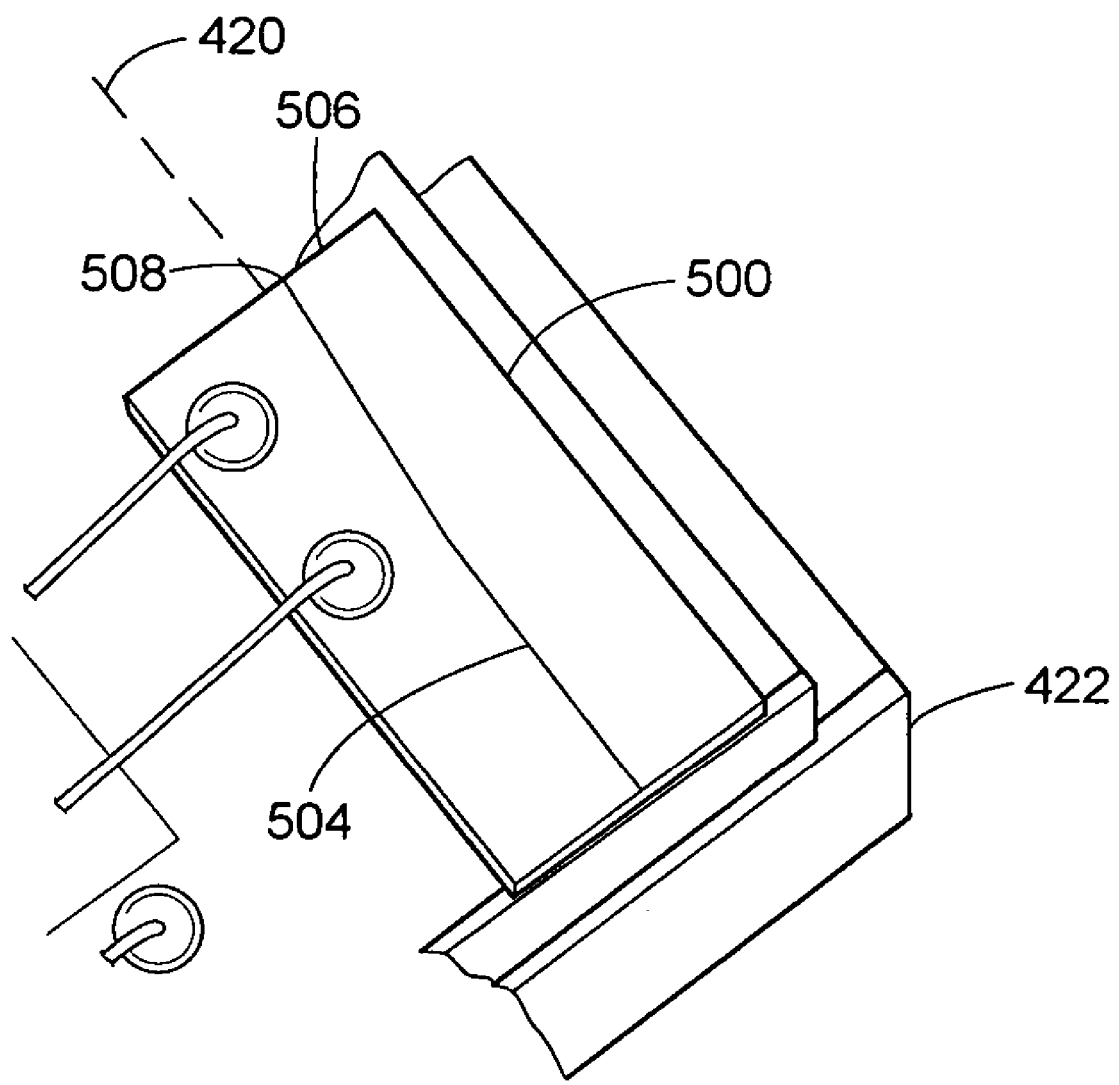
FIG. 5 illustrates a laser diode that is used in verifying the virtual optical axis determined from the image of FIG. 4.

The end mirror 402 is positioned on a platform 422. FIG. 5 illustrates a laser diode 500 that is also mounted to the platform 422. The laser diode 500 includes a gain region 504 having a front facet 506. From a top view of a camera, a machine vision system can determine an exit point 508 of the front facet 506, i.e., at the intersection of the facet 506 and the waveguide 504. The system may extrapolate out the virtual optical axis determined from the end mirror 402, axis 420, and find where it intersects the front facet 506. This extrapolation may take into account whether the optical axis 420 was derived over a secondary coordinate system or a reference coordinate system, whether the image of the laser diode 500 is in another secondary coordinate system or in the reference coordinate system. The extrapolation may also take into account any intervening optical elements between the end mirror 402 and laser diode 500, e.g., a collecting lens, using ray-tracing or other techniques. After extrapolation, the distance between the exit point 508 and the point of intersection of the virtual optical axis 420 is determined. This calculation serves as a verification of the accuracy of the virtual optical axis. This calculation provides a measure of the beam pointing accuracy that results from the previous lens alignment/attachment process. If the lens is aligned perfectly so that it is centered in (X, Y) with respect to the actual laser beam, then the optical axis would pass through the exit point 508. A non-zero distance indicates process variability and is subject to a spec. (e.g. 50 microns) based on the process window (e.g. 0.5 degree). Parts with large pointing errors from the lens assembly process can be rejected at this step, because they may lead to marginal performance of the overall laser. More importantly, the distance calculation serves to check the roll orientation of the end-mirror 402. Because the end-mirror 402 has a 0.6 degree wedge angle and because it has an electrical polarity, it has to be assembled in a certain roll orientation. However, due to inadvertent mistakes in manufacturing, the mirror is sometimes assembled with the opposite roll (180 degrees off). In that case, this has to be detected by the vision system (humans cannot detect it) and the direction of the 1 or 2 degree yaw offset applied has to be reversed. Once the virtual optical axis has been verified, i.e., determined to fall within an accepted distance range, then the virtual optical axis may be extrapolated for any field of view of the machine vision system and used to align any optical element in the external cavity or having a positional relationship relative thereto. This allows these optical elements to be passively aligned with the optical axis, and thus with the laser diode 500 and end mirror 402.

Figure 6:
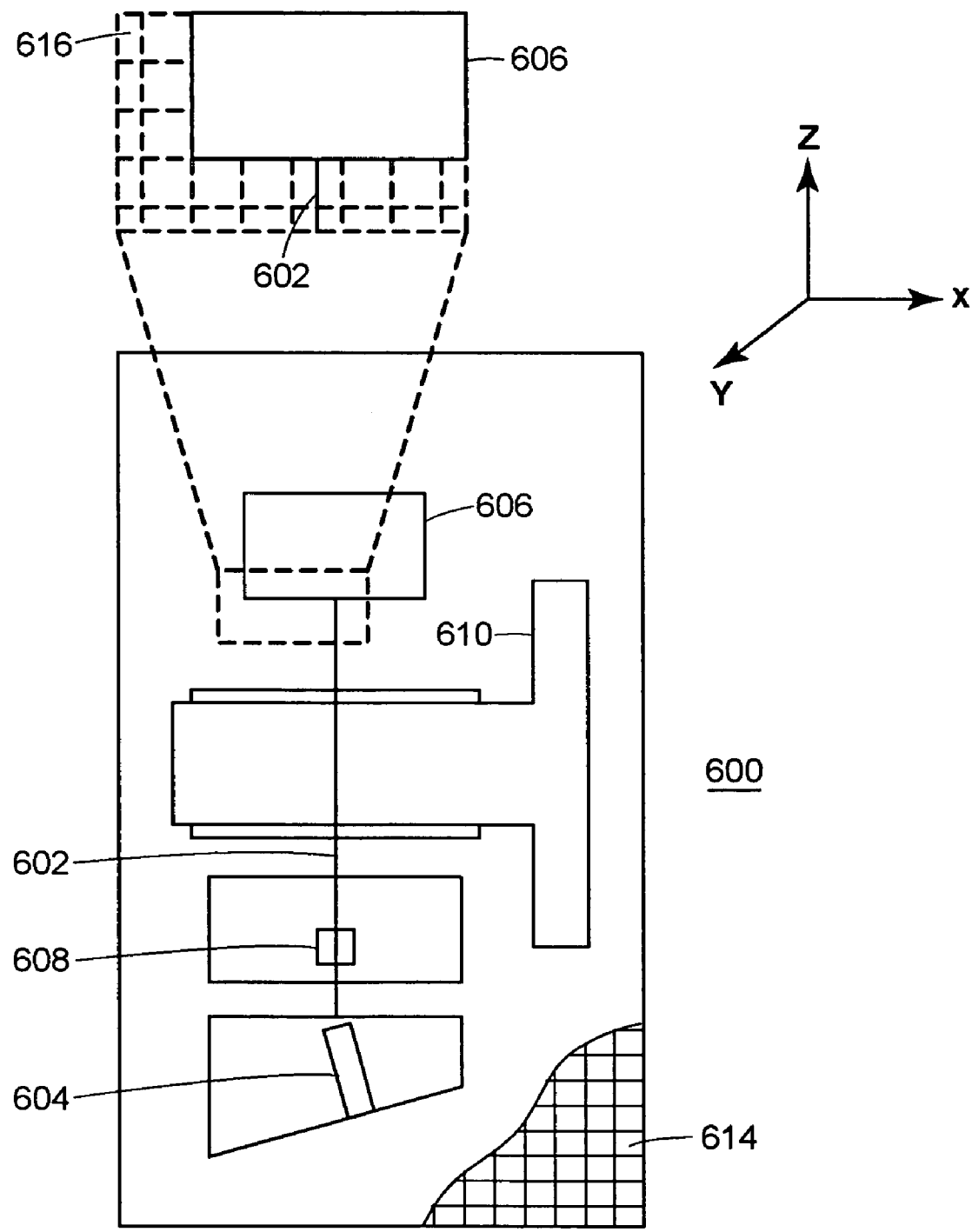
FIG. 6 illustrates a top view of an example laser apparatus in which the optical axis has been passively determined and used in aligning a wavelength selection device.

FIG. 6 illustrates a laser apparatus 600 after an optical axis 602 has been passively determined, e.g., in accordance with the above-described techniques. The optical axis 602 extends from laser diode 604 to end mirror 606, and in the illustrated example extends through a collimation lens 608. The optical axis may or may not be a straight line along its entire length, but it is piece-wise straight. This is especially true for the output side of the laser where the laser beam passes through a prism. However, the same general principle applies whether the optical axis is a single straight line or a collection of straight and/or curved line segments. A wavelength selection device 610 has been aligned with respect to this optical axis 602 and mounted on platform 612 for tuning. The optical axis 602 is shown on a reference coordinate system 614 and in a secondary coordinate system 616 in an expanded image of a corner portion of the end mirror 606. The X and Z plane of the two coordinate systems 614, 616 are illustrated. In the illustrated example, the device 610 is a dual-etalon Vernier tuning element that has been aligned along four directions, X, Y, Z, and yaw. Example alignments are discussed in reference to FIGS. 7 and 8 below.

Figure 7:
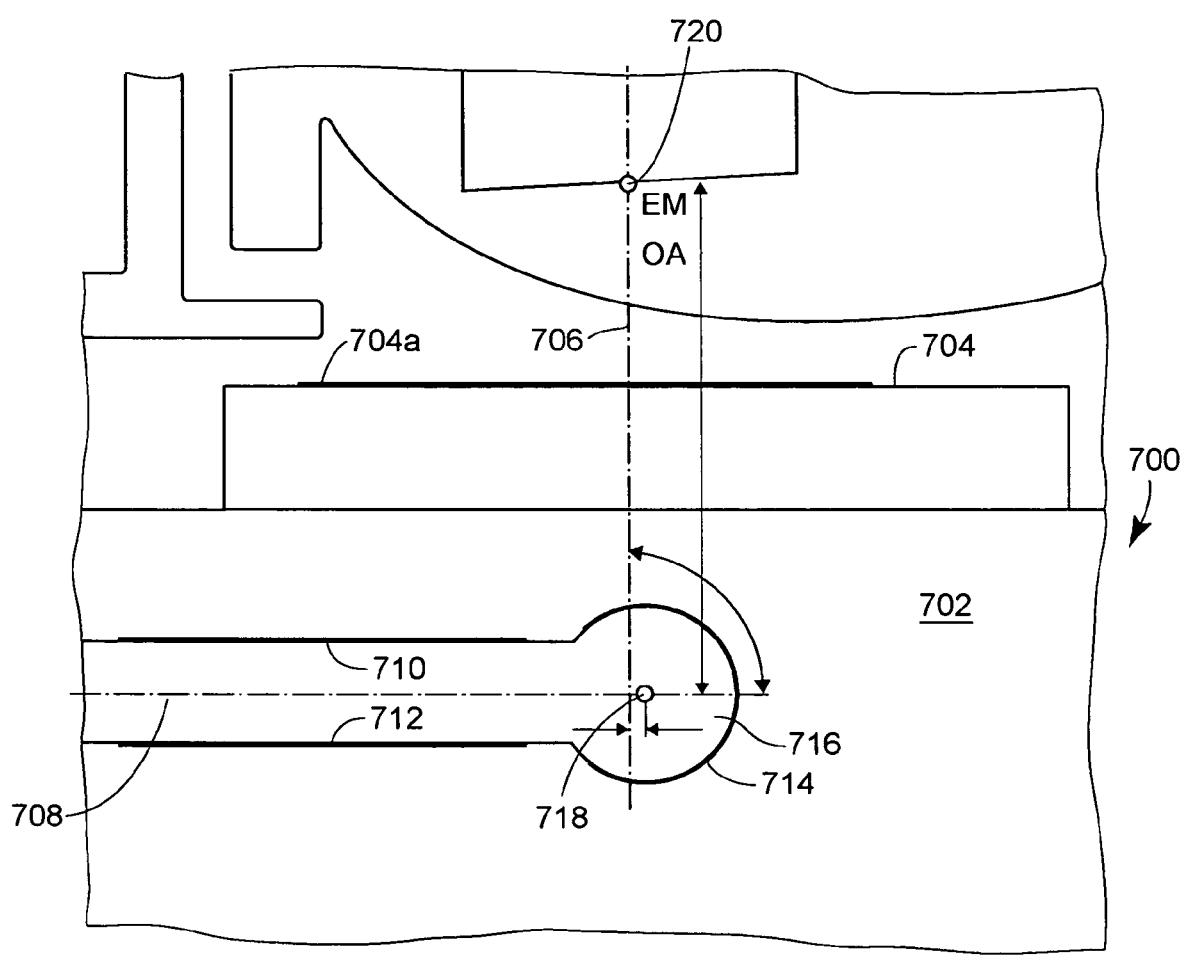
FIG. 7 illustrates an image of passive yaw, X and Z alignment for a wavelength selection device, based on a passively determined optical axis.

FIG. 7 illustrates example yaw, X and Z alignment for a wavelength selection device 700 based on a passively determined optical axis. FIG. 7 illustrates a support 702 and one of the two etalons, the etalon shown bearing the reference number 704. As a first feature, a top edge of the etalon 704 is identified by the machine vision system, and an edge approximation line 704a is derived as the corresponding positional data. The passively determined optical axis 706 is illustrated. To align for yaw, the system determines the angle between the line 704a and the optical axis 706. For 0° yaw, this angle is set to 90°. However, for systems in which it is desirable to introduce a small offset angle on the wavelength selection device 700, for example, to reduce optical feedback to the laser diode, a 1° to 2° yaw angle may be used, in which case the offset would be between 91° and 92°. Using line 704a and the optical axis 706 to determine a yaw position is provided by way of example. It is also possible to detect both filters (or multiple optical elements in the general case) and to take an average (or a weighted average) of their positions/orientations. Ditto for the mechanical carriers onto which these optical elements may be mounted. The system may identify another line, such as line 708 which may be derived from finding a first inner edge 710 and approximation line for the support 702, a second inner edge 712 and approximation line, and calculating the mid-line 708 between the two. To adjust for yaw angle difference, the offset angle identified by the system may be converted into an instruction to a mounting assembly to rotate the position of the wavelength selection device 700 until the machine vision system records a desirable offset angle.

In this example, with the yaw alignment achieved, X and Z are aligned. The system, for example, may identify an arcuate edge 714 of fiducial 716, or other alignment marker on the support 702. The center point 718 of the fiducial 716 is determined from this positional data. For X direction alignment, the system may calculate the distance between the center point 718 and the optical axis 706, and any undesired offset removed by translating the device 700 the corresponding amount. For Z direction alignment, the system may calculate the distance between the center point 718 and a point 720, the midpoint of the front edge of the end mirror, like midpoint 416 in FIG. 4. Whereafter, the system distance can move the device 700 along the Z-direction to match a to a desired distance value between these two points.

Figure 8:
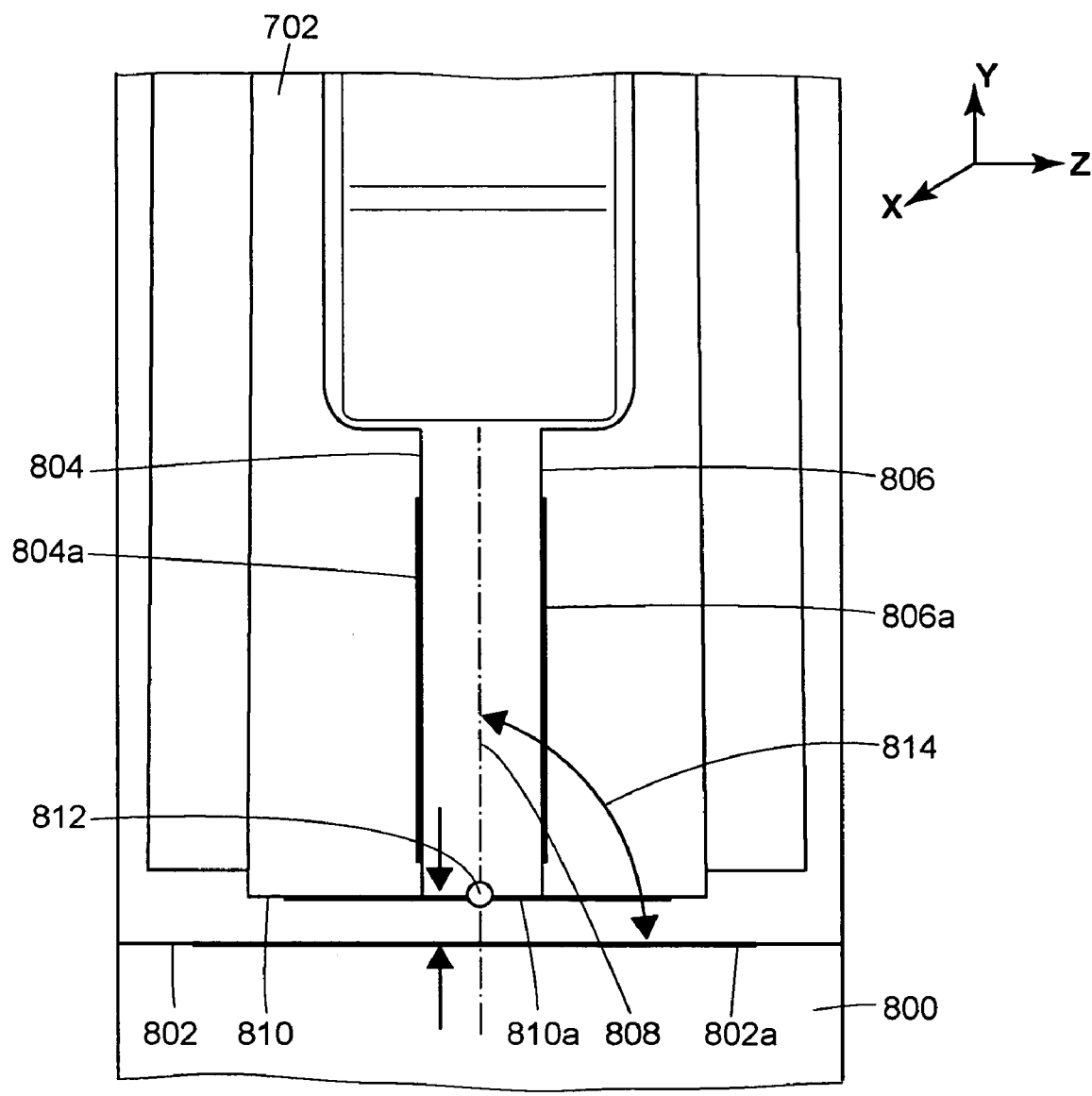
FIG. 8 illustrates an example of pitch alignment of a wavelength selection device.

FIG. 8 illustrates an example pitch and Y alignment for the wavelength selection device 700. A side view of a platform 800 and the support 702 is shown. A free end of the support 702 is shown, with an opposing end (not shown) gripped by a placement arm. A top edge 802 of the platform 800 and a corresponding approximation line 802a are obtained to establish a baseline for the Y direction. A first inner edge 804 and second inner edge 806 of the support 702 are determined, along with approximation lines 804a and 806a. From these lines, a center line 808 is calculated as a mid line. A bottom edge 810 of the support 702 is determined along with an approximation line 810a. The system then determines the intersection point 812 of the center line 808 and the approximation line 810a. To align along the Y direction, the distance between point 812 and line 802a is determined and then the support 702 is positioned until the value is a desired value. This distance may be set to a fixed value or a dynamic value that changes depending upon, for example, previously obtained position data or other data for the laser apparatus. To align along the pitch direction, an angle 814 between approximation line 802a and the mid line 808 may be determined. This angle may be set to a desired angle, such as 90° pitch orientation or a slightly inwardly tiled angle, for example 88° or 89°. After setting the pitch angle to a desired amount, the system may recalculate the distance between the point 812 and the line 802a and then reset the support 702 to a desired distance.

Figure 9:
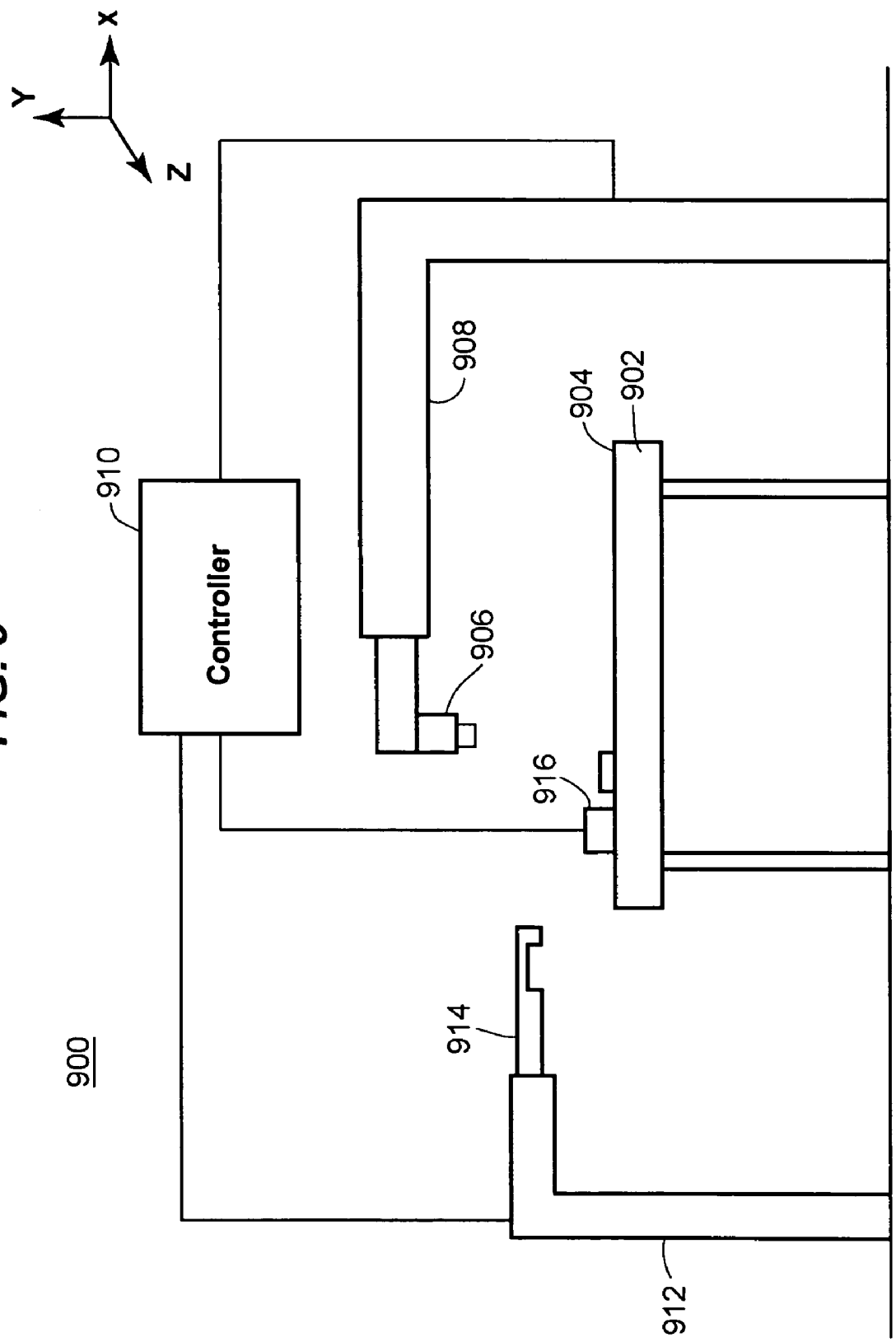
FIG. 9 illustrates and example machine vision system that may be used to passively determine an optical axis.

FIG. 9 illustrates an example machine vision or computer vision system 900 that may be programmed in accordance with the example techniques described above. The system 900 includes a workbench 902 having an assembly surface 904 upon which pick-and-place assembly of a laser apparatus may occur, for example. A camera 906 is mounted above the workbench 902 and is coupled to a translation device 908 (movable at least over an XZ plane) that moves the camera 906 under direction of a controller 910, e.g., a personal computer, integrated circuit, or microprocessor. Although not shown, it will be appreciated that the controller 910 may execute code such as software routines to implement various processes. For example, the controller 910 may be a computer with memory and storage media, as well as a keyboard and/or other input device and a monitor or other display device. By way of example, the camera 906 may be a digital charge-coupled device (CCD) used in imaging. The camera 906 more generally represents any image recording device or optical element for capture image data. The controller 910 of the illustrated example is also coupled to an assembly device 912 with positioning arm 914 capable of moving an optical element 916 along X, Y, and Z directions, and in some examples along pitch, yaw and roll directions. The device 912 positions the various optical elements on the laser apparatus during alignment, both active and passive, as well as during passive determination of the optical axis. The controller 910 is also coupled to a detector 916 that may be used during active alignment of various optical elements, for example, prior to

What we claim is:

1. A method of optical alignment in a laser apparatus having an external cavity, the method comprising:
   positioning a laser source on a platform;
   actively aligning a first component of the external cavity; and
   passively determining an optical axis extending between the first component and the laser source, by passively determining the optical axis in a secondary coordinate system and extrapolating the optical axis determined in the secondary coordinate system to a reference coordinate system, wherein the secondary coordinate system is a magnified rendition of the reference coordinate system.

2. The method of claim 1, wherein passively determining the optical axis comprises:
   identifying at least one feature of the first component;
   deriving at least one positional data from the at least one feature; and deriving the optical axis from the at least one positional data.

3. The method of claim 2, wherein the first component is a reflective element and wherein the at least one feature includes an edge of the reflective element.

4. The method of claim 1, further comprising:
   passively determining the optical axis from a position of the first component; and
   comparing the optical axis to the position of the laser source; and
   verifying the optical axis from the comparison of the optical axis to the position of the laser source.

5. The method of claim 1, further comprising passively aligning a optical element from the optical axis.

6. The method of claim 5, wherein the optical element is a wavelength selection device.

7. The method of claim 5, further comprising passively aligning the optical element along at least two of an X-direction, a Y-direction or a Z-direction.

8. The method of claim 5, further comprising passively aligning the optical element along a pitch direction.

9. The method of claim 7, further comprising passively aligning the optical element along a yaw direction.

10. The method of claim 1, further comprising placing a gold pad below the first component.

11. The method of claim 1, further comprising machining a slot in a tuner carrier of the laser source.

12. A method of determining an optical axis for an external cavity laser apparatus and in a reference coordinate system, the method comprising:
    aligning a laser source with an optical element having an edge that defines an external cavity with a facet of the laser source;
    identifying at least one feature of the optical element in a secondary coordinate system;
    deriving at least one positional data from the at least one feature and in the secondary coordinate system;
    extrapolating the at least one positional data in the secondary coordinate system to a reference coordinate system, wherein the secondary coordinate system is a magnified rendition of the reference coordinate system; and
    passively determining an optical axis for the reference coordinate system, such that an optical element may be aligned relative to the passively determined optical axis.

13. The method of claim 12, wherein the optical element is an end mirror, the edge is a front reflective surface of the end mirror, and the at least one feature includes the edge.

14. The method of claim 13, wherein deriving the at least one positional data includes deriving an approximation line of the edge and a center point on the edge.

15. The method of claim 14, wherein passively determining the optical axis comprises: verifying the optical axis in the second secondary coordinate system.

16. A method of determining an optical axis for an external cavity laser apparatus and in a reference coordinate system, the method comprising: aligning a laser source with an optical element having an edge that defines an external cavity with a facet of the laser source; identifying an exit point and a mid-point of the optical element in a secondary coordinate system; deriving at least two positional data from the exit point and the mid-point and in the secondary coordinate system; extrapolating the at least two positional data in the secondary coordinate system to a reference coordinate system; and passively determining an optical axis for the secondary coordinate system, wherein the secondary coordinate system is a magnified rendition of the reference coordinate system; such that an optical element may be aligned relative to the passively determined optical axis.

17. The method of claim 16, wherein the optical element is an end mirror with the mid-point and exit point.

18. The method of claim 17, wherein passively determining the optical axis comprises:
    verifying the optical axis in a second secondary coordinate system.

* * * * *